United States Patent [19]
Matsuoka et al.

[11] Patent Number: 5,493,150
[45] Date of Patent: *Feb. 20, 1996

[54] IC CARRIER

[75] Inventors: Noriyuki Matsuoka, Yokohama; Kazumi Uratsuji, Tokyo; Shunji Abe, Yokohama, all of Japan

[73] Assignee: Yamaichi Electronics Co., Ltd., Tokyo, Japan

[ * ] Notice: The term of this application shall not extend beyond the expiration date of Pat. No. 5,289,820.

[21] Appl. No.: 195,079

[22] Filed: Feb. 14, 1994

[30] Foreign Application Priority Data

Feb. 15, 1993 [JP] Japan .................. 5-048614

[51] Int. Cl.⁶ .................. H01L 23/495; H01L 23/34; H01L 23/02
[52] U.S. Cl. .................. 257/668; 257/727; 257/678; 439/259
[58] Field of Search .................. 257/668, 669, 257/727, 678; 435/259, 266, 296

[56] References Cited

U.S. PATENT DOCUMENTS

| | | | |
|---|---|---|---|
| 3,409,861 | 11/1968 | Barnes et al. | 339/174 |
| 3,892,312 | 7/1975 | Tems | 206/328 |
| 4,598,308 | 7/1986 | James et al. | 257/678 |
| 4,692,790 | 8/1987 | Oyamada | 257/688 |
| 4,718,548 | 1/1988 | Estrada et al. | 206/329 |
| 4,747,483 | 5/1988 | Grabbe | 206/329 |
| 4,881,639 | 11/1989 | Matsuoka et al. | 206/328 |
| 4,886,169 | 12/1989 | Ayers et al. | 206/591 |
| 4,918,513 | 4/1990 | Kurose et al. | 257/696 |
| 4,933,747 | 6/1990 | Schroeder | 257/727 |
| 5,066,245 | 11/1991 | Walker | 439/526 |
| 5,070,389 | 12/1991 | Noriyuki | 257/678 |
| 5,076,794 | 12/1991 | Ganthier | 439/70 |
| 5,133,256 | 7/1992 | Keaton | 101/481 |
| 5,168,993 | 12/1992 | Yen | 206/316.1 |
| 5,220,196 | 6/1993 | Michii et al. | 257/668 |
| 5,238,110 | 8/1993 | Ye | 206/329 |
| 5,289,032 | 2/1994 | Higgins, III et al. | 257/669 |
| 5,296,741 | 3/1994 | Kim | 257/724 |
| 5,389,820 | 2/1995 | Matsuoka | 257/727 |

FOREIGN PATENT DOCUMENTS

| | | | |
|---|---|---|---|
| 1-272142 | 10/1989 | Japan | 257/727 |
| 2-36556 | 2/1990 | Japan | 257/698 |
| 3-29903 | 6/1991 | Japan | 206/329 |

Primary Examiner—Rolf Hille
Assistant Examiner—T. M. Arroyo
Attorney, Agent, or Firm—Wenderoth, Lind & Ponack

[57] ABSTRACT

An IC carrier comprising a case for receiving an IC, a carrier body for receiving the case, and a positioning device for correctly positioning the IC which is received in the case.

12 Claims, 5 Drawing Sheets

5,493,150

IC CARRIER

BACKGROUND OF THE INVENTION

1. Field of the Invention

This invention relates to an IC carrier for carrying an IC thereon so as to be loaded on a socket.

2. Description of the Prior Art

In general, an IC carrier is used as means for protecting, transporting and storing an IC. In a test for discriminating defective IC from non-defective IC, the IC carrier carrying an IC thereon is loaded on an IC socket so that contact elements of the IC are brought into electrical connection with contacts of the IC socket.

However, the conventional IC carrier had the following problem. That is, when the IC carrier carrying an IC thereon is loaded on the socket, the contacting points of the IC are frequently readily displaced from the corresponding contacts of the socket and therefore, a reliable electrical connection is unobtainable between each contacting point and contact. This problem is particularly serious for an IC of a miniature size having a number of contact elements in a dense arrangement.

The miniature-sized thin IC of the type outlined above requires very careful handling when the IC is loaded on the carrier because the IC is readily damaged during the operation of loading onto the carrier.

OBJECTS AND SUMMARY OF THE INVENTION

It is, therefore, an important object of the present invention to provide an IC carrier, in which an IC socket and an IC can assuredly be placed in correct corresponding relation to each other.

Another object of the invention is to provide an IC carrier which is capable of fully protecting an IC.

From one aspect of the present invention, there is essentially provided, in order to achieve the above objects, an IC carrier comprising a case for receiving an IC, a carrier body for receiving the case, and positioning means for correctly positioning the IC which is received in the case.

From another aspect of the invention, there is also provided an IC carrier comprising a case for receiving an IC, a carrier body for receiving the case, and positioning means for correctly positioning the IC which is received in the case, the IC and the case being covered with a wiring sheet held by the carrier body and provided on the carrier body, contact elements of the IC being contacted with a lead pattern of the wiring sheet.

DETAILED DESCRIPTION OF THE INVENTION

Figure 1:
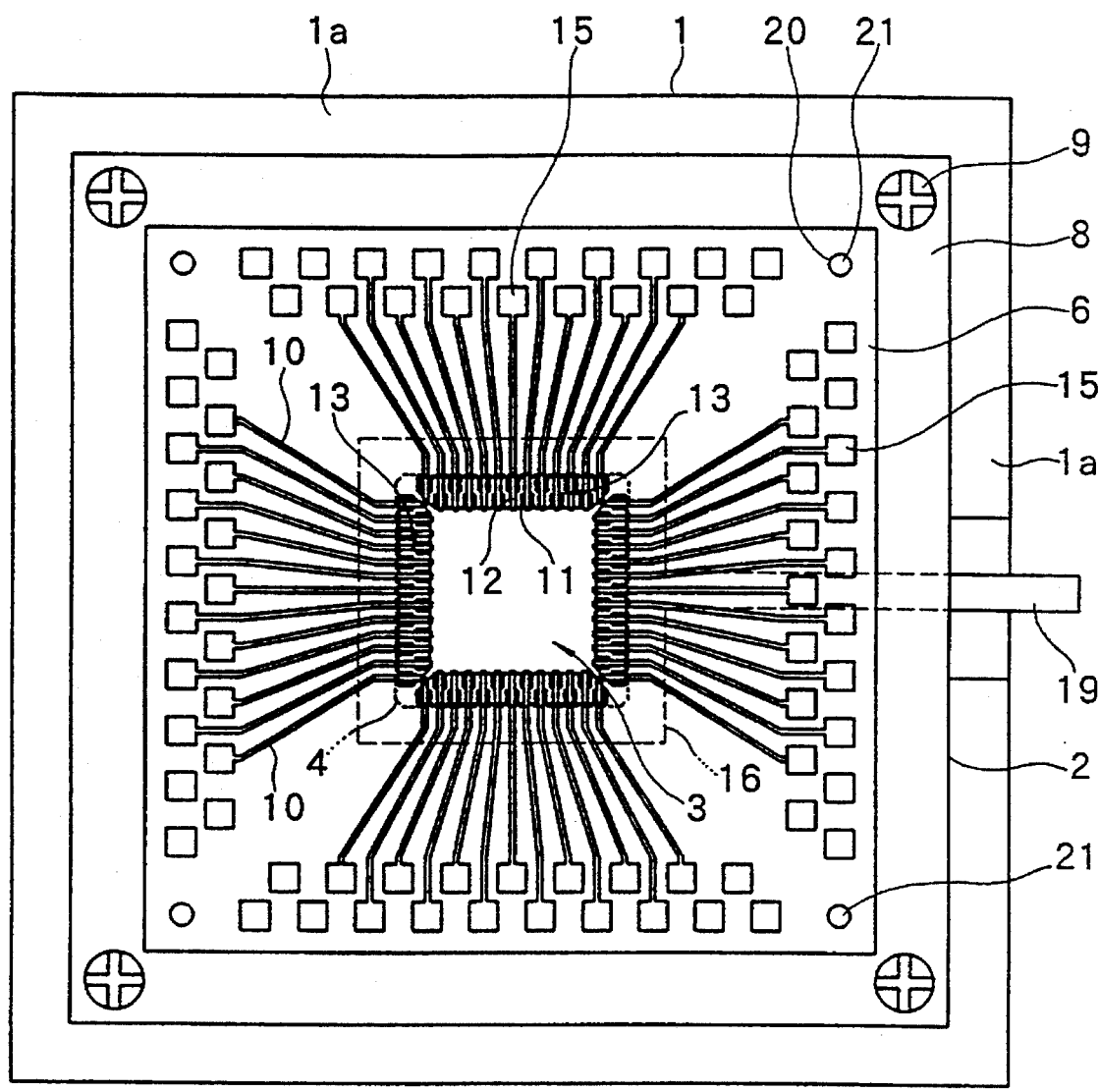
FIG. 1 is a plan view of an IC carrier according to one embodiment of the present invention.
Figure 2:
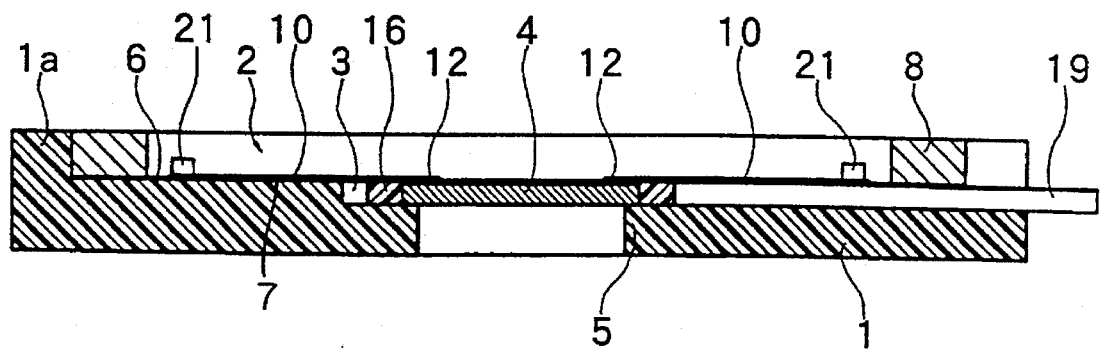
FIG. 2 is a cross-sectional view of the IC carrier of FIG. 1.
Figure 3:
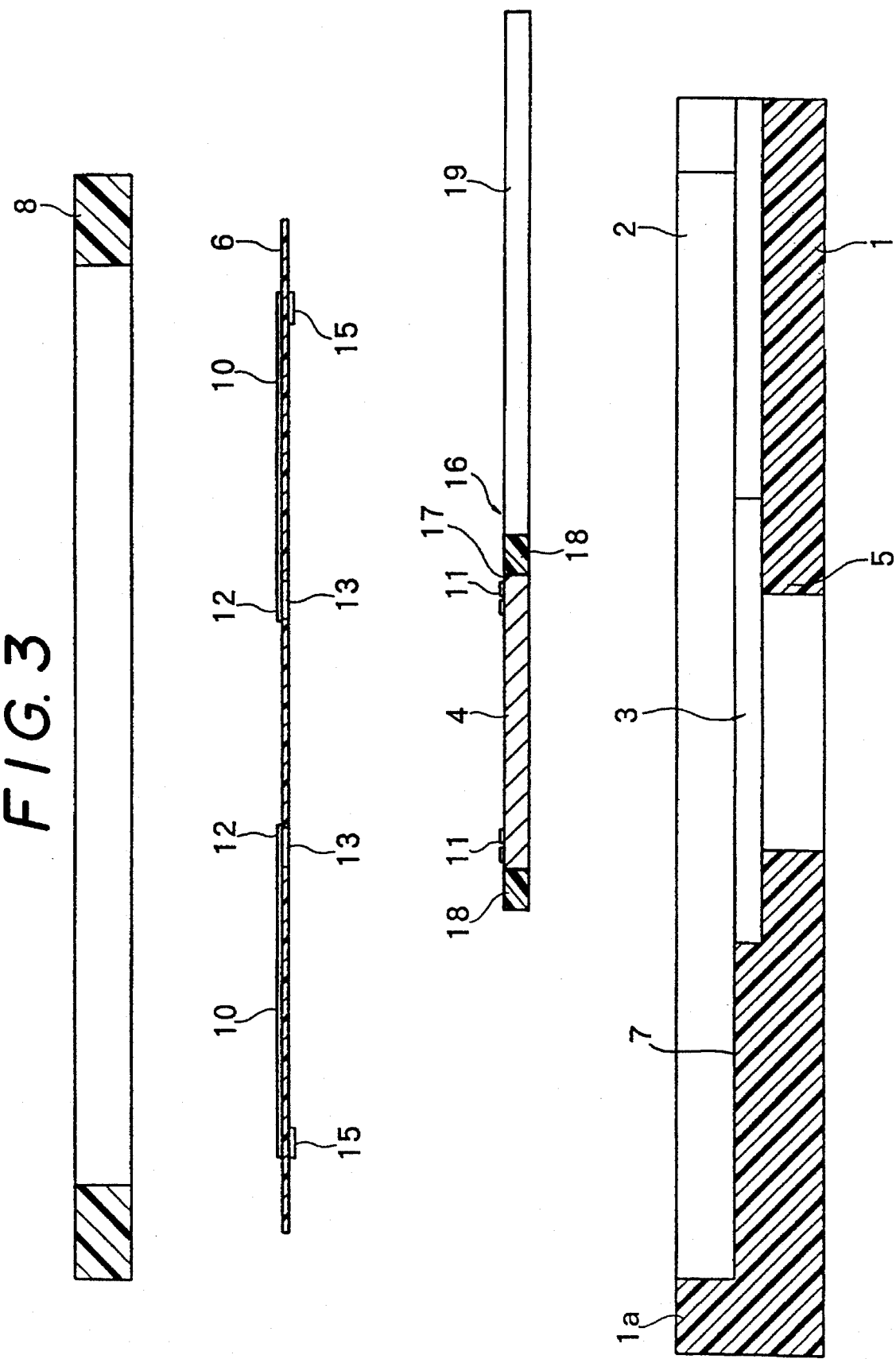
FIG. 3 is an exploded cross-sectional view of the IC carrier of FIG. 1.

Several embodiments of the present invention will be described with reference to FIGS. 1 to 8 inclusive. As shown in FIGS. 1 to 3, as well as elsewhere, a carrier body 1 formed of an electric-insulative material is of a planar square configuration. The carrier body 1 includes a square sheet receiving portion 2 whose one surface is open and an IC receiving or IC case receiving portion 3 which is formed in a central portion of the sheet receiving portion 2 and open to an inner bottom surface of the sheet receiving portion 2.

An IC 4 is received in a square case 16 formed of an electric-insulative material. The case 16 with the IC 4 received therein is, in turn, received in the IC receiving portion 3 so as to be supported on a support seat 5. A wiring sheet 6 is received in the sheet receiving portion 2 so as to be supported on a support seat 7 which is formed on a bottom thereof.

The IC 4 placed in the case 16 which is supported on the support seat 5 is in contact relation or proximal relation with the wiring sheet 6 supported on the support seat 7 at a central portion of the wiring sheet 6. The IC 4 and the case 16 are covered with the wiring sheet 6. The arrangement being such that the surface of the IC 4 placed in the case 16 which is received in the IC receiving portion 3 is generally coplanar with the support seat 7.

The case 16 includes an IC receiving chamber 17 having a square configuration, and a frame-like peripheral wall 18 which defines the receiving chamber 17. The IC 4 is restricted by this peripheral wall 18.

The IC 4, the case 16 and the wiring sheet 6 are integrally assembled together with the carrier body 1 in superimposed relation. As shown in FIGS. 1, 2 and 3 for example, as one assembling means of the type just mentioned, a framework 8 is formed having generally the same outer dimensions as the inner dimensions of the sheet receiving portion 2. Such formed framework 8 is fitted to the inner peripheral edge of the sheet receiving portion 2, and corner portions of the framework 8 are tightly secured to the carrier body 1 by screws 9 or the like. By fixing the wiring sheet 6 to the support seat 7 of the carrier body 1, the IC 4 and the case 16 are held between the sheet 6 and the support seat 7 of the carrier body 1.

Figure 4:
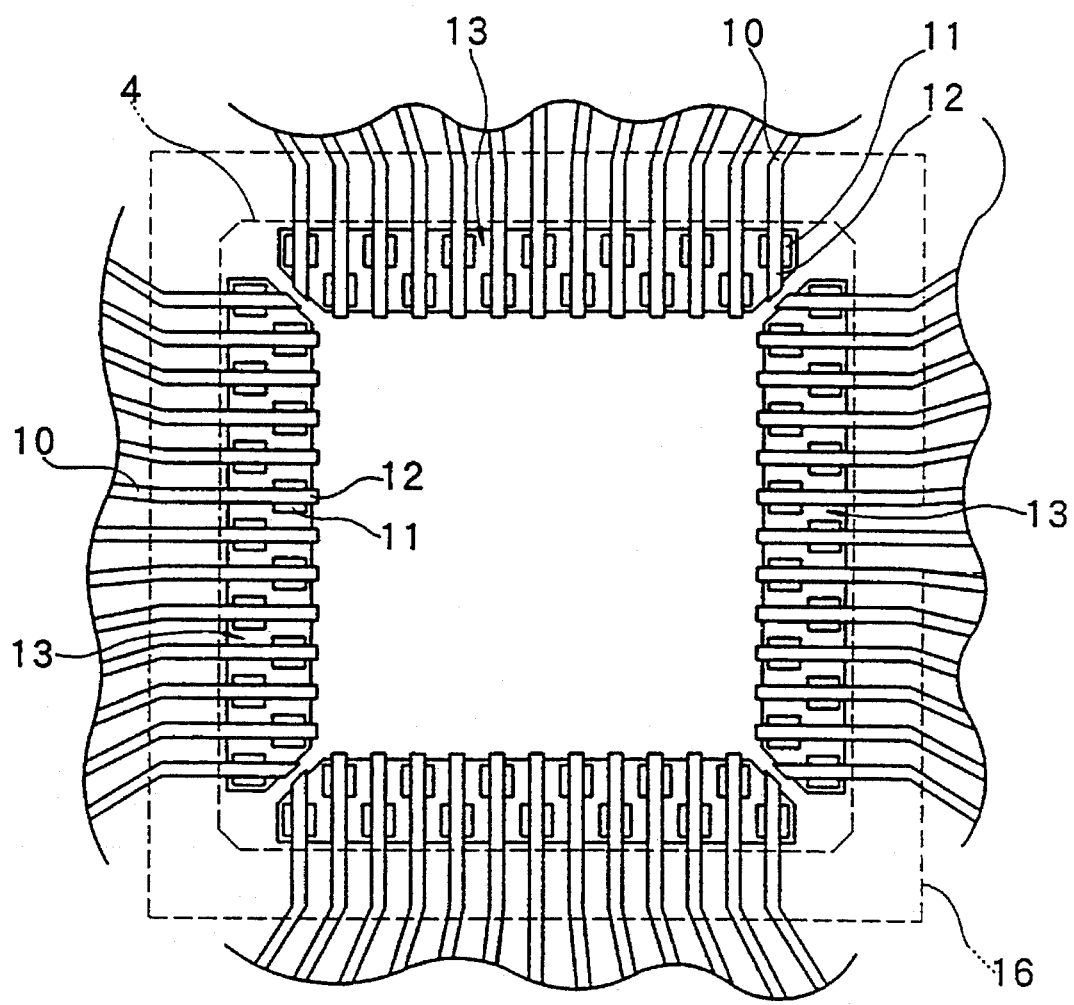
FIG. 4 is an enlarged plan view showing a wiring sheet and an IC contact portion in the IC carrier of FIG. 1.
Figure 5:
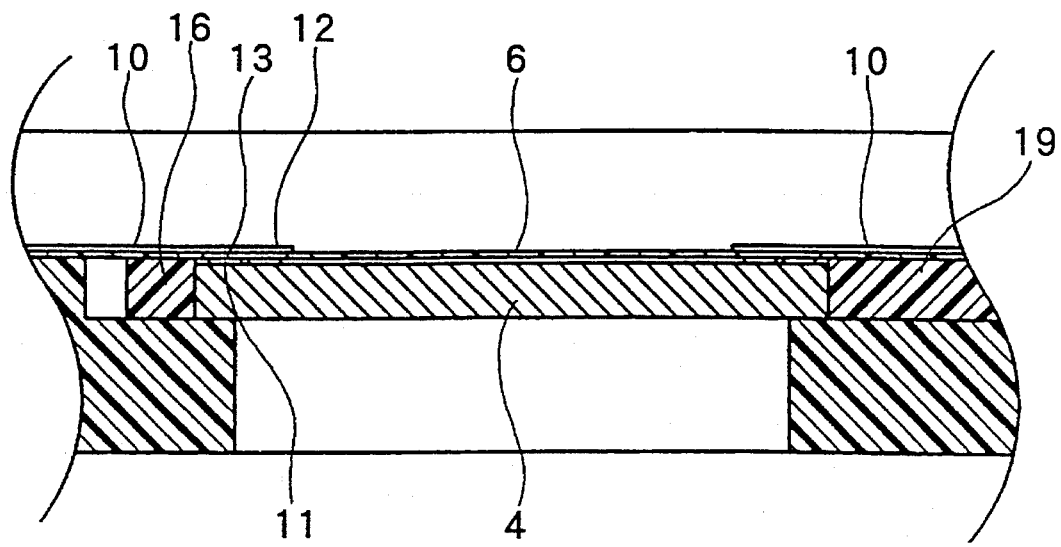
FIG. 5 is an enlarged cross-sectional view of FIG. 4.
Figure 6:
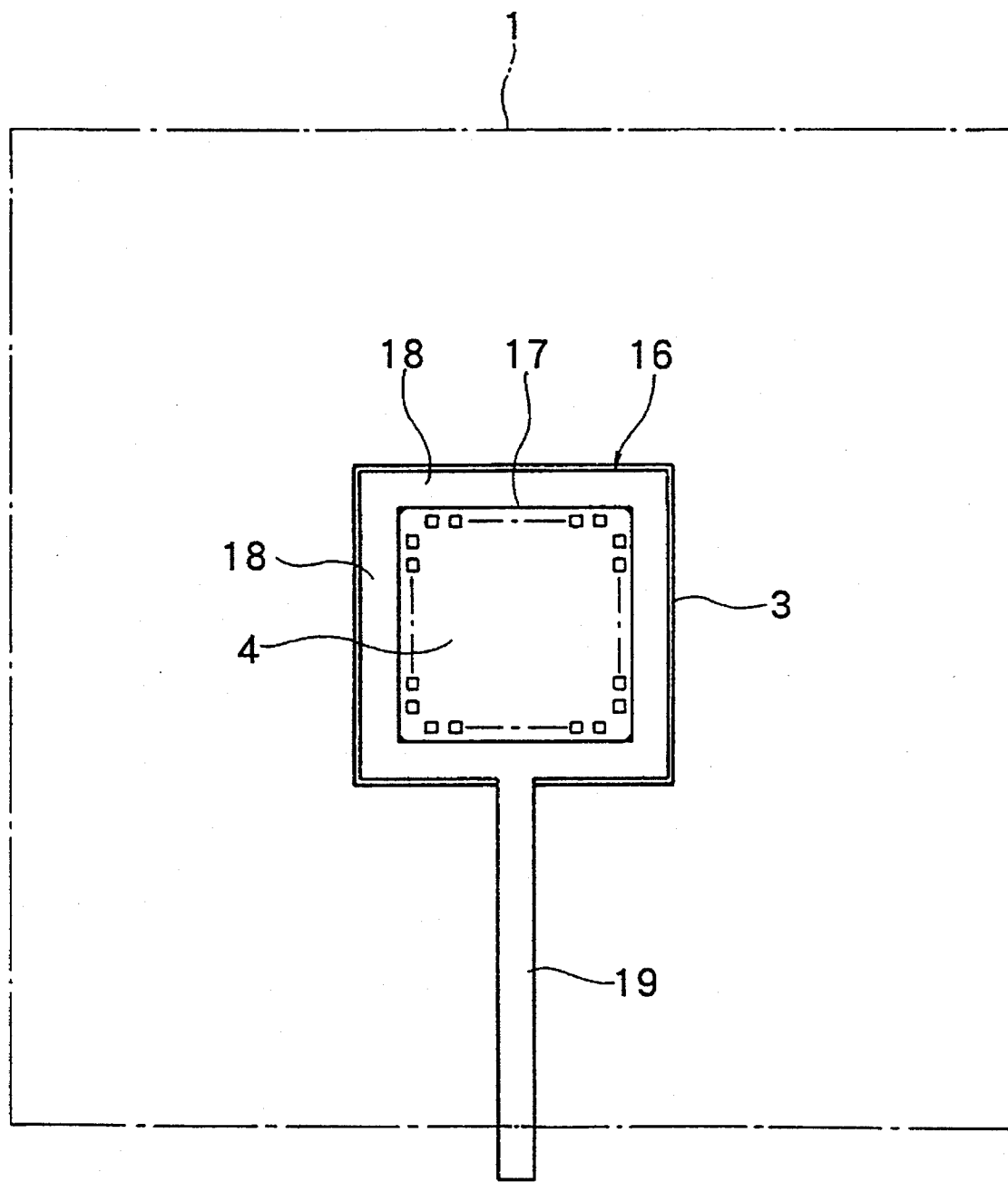
FIG. 6 is a plan view showing one example of an IC receiving case.

As shown in FIGS. 3 and 4, the IC 4 is square in outer configuration and has a number of contact elements 11 arranged in array on its surface. First contacting pads 12, as will be described hereinafter, of the wiring sheet 6 are placed on top of the contact elements 11 so as to contact leads 10, respectively. The contact elements 11 of the IC 4 are held in contact or proximal relation with the first contacting pads 12 of a wiring pattern, and the wiring sheet 6 is pressed toward the socket body side so that the contact elements 11 and the pads 12 are pressure-contacted with each other, respectively.

The wiring sheet 6 is formed of a flexible electric-insulative material such as, for example, a synthetic resin film, and has a lead pattern corresponding to the contact elements 11 of the IC 4 on its surface. The wiring sheet may be formed of a wiring substrate having a comparatively rigid property. Each lead 10 forming the lead pattern is closely adhered to the wiring sheet 6, for example, by printing and extends radially over the peripheral edge portion from the central portion (i.e. the portion superimposed with the IC 4) of the wiring sheet 6. Each lead 10 has, at its inner end reaching the superimposed portion, the first contacting pad 12 arranged at a small pitch in such a manner as to be opposite to each contact element 11 formed on the surface of the IC 4, and at its outer end reaching the peripheral edge portion of the wiring sheet 6, a second contacting pad 15 arranged at a large pitch in such a manner as to be opposite to each contact of the socket body. That is, the second pads 15 formed at the outer ends of the leads 10 are spread widely over the outer area of the IC 4 so as to be contacted with the contacts. For example, the second contacting pads 15 are arranged, side by side, on an inner peripheral surface of the framework 8.

As shown in FIGS. 1 and 2, the lead pattern is formed on the outer surface side of the wiring sheet 6. Each of the first contacting pads 12 is contacted in opposite relation with each of the contact elements 11 of the IC 4 through an opening as will be described later formed in the wiring sheet 6.

The IC 4 is received in the case 16 in such a manner as to leave almost no play and with the contact element 11 of the IC 4 exposed from the open surface of the case 16 so as to be contacted with the first contacting pad 12 of the wiring sheet 6. This case 16 is received in the IC receiving portion 3 such that the case 16 is only permitted a small amount of movement in a horizontal direction within the IC receiving portion 3. In other words, the case 16 is received in the IC receiving portion 3 such that the case 16 is capable of sliding on the surface of the support seat 5 in a horizontal direction while holding the IC 4.

As shown in FIG. 3, the case 16 is formed by a square framework having an opening vertically extending all the way therethrough, and the IC 4 is fitted in and held by the case 16. The IC 4 may be fixed to an inner peripheral surface of the case 16 through an adhesive agent or the like.

As described above, the IC 4 is received in the case 16, and is then movably received in the IC receiving portion 3 of the carrier body 1 through the case 16. The carrier body 1 is provided with a positioning means such as a push pin, a cam or the like for pressing the side surface of the IC receiving case 16 to move within the IC receiving portion 3 so as to be correctly positioned.

As one example of this positioning means, as shown in FIGS. 1 to 3 or FIG. 6, the case 16 is provided with an operating lever 19 extending horizontally therefrom, this operating lever 19 being left projected from an outer side surface of the carrier body 1, and the case 16 is horizontally moved for a very small amount within the IC receiving portion 3 by operating the operating lever 19.

By doing this, the contact elements 11 of the IC 4 and the first contacting pads 12 are placed in corresponding relation to each other and also placed in corresponding relation to the contacts of the IC socket through the lead pattern. It is possible to place the contact elements 11 of the IC 4 and the contacts of the socket in corresponding relation to each other by contacting the contact elements directly to the contacts without using the wiring sheet 6.

The wiring sheet 6 is provided with openings 13 so that the corresponding relation between the IC contact elements 11 and the first contacting pads 12 can be recognized by eyes through the openings 13. FIGS. 1 and 4 show concrete examples of the openings 13. As shown in these Figures, inner ends (first contacting pads 12) of the leads 10 converged toward to the central portion of the wiring sheet 6, and are arranged along each side of the IC 4 placed in the central portion in such a manner as to correspond to the IC contact elements 11 group arranged along each side. The openings 13 are formed at locations where the first contacting pads 12 and the IC contact elements 11 are placed in corresponding relation to each other. That is, elongated openings 13 are formed at each of the four sides or at least two opposite sides, so that the whole or a large part of the first contacting pads 12 and the IC contact elements 11 placed in opposite relation at each side can be seen by naked eyes.

Through the openings 13, the corresponding relation between the first contacting pads 12 and the IC contact elements 11 can clearly be recognized by eyes. While viewing through the openings 13, the positioning means including the operating lever 19 or a cam or a push pin or the like is operated to slightly move the IC 4 along the inner surface of the wiring sheet 6. By doing this, the first contacting pads 12 and the IC contact elements 11 can be placed in correct corresponding relation to each other.

On the other hand, the wiring sheet 6 is positioned by an inner surface or an inner corner portion of a peripheral wall 1a arranged in a square form and defining the sheet receiving portion 2 of the carrier body 1. Then, the wiring sheet 6 is fixed to the carrier body 1 by the framework 8. Otherwise, as shown in FIG. 1, a peripheral edge portion, for example, a plurality of corner portions, of the wiring sheet 6 are provided with positioning holes 20, and positioning posts 21 provided on a plurality of corner portions of the support seat 7 are inserted into the positioning holes 20 so that the wiring sheet 6 is supported by the support seat 7 at its predetermined position. The diameters of the positioning posts 21 are formed smaller than the diameters of the positioning holes 20, so that the wiring sheet 6 can be horizontally moved in all directions owing to the difference in diameter. After wiring sheet 6 is placed in correct corresponding relation to the IC 4, the framework 8 is tightened to the carrier body 1 by the screws 9, so that the wiring sheet 6 is firmly held between the framework 8 and the carrier body 1.

By assembling the carrier body 1, the IC 4 and the wiring sheet 6 in the manner as described, the IC 4 is hidden between the carrier body 1 and the wiring sheet 6. In this condition, the carrier body 1 is favorably protected, transported and stored. Also, by loading the above assembly directly on the socket, the second contacting pads 15 exposed from the outer surface of the wiring sheet 6 are pressed against the contacts of the socket for electrical connection, so as to be subjected to aging tests.

In where no wiring sheet 6 is used, the IC is placed in and held by the case through means for intimately fitting the IC 4 into the IC receiving case 16 or resiliently supported in the case 16 by a spring member, and this case 16 is held by the carrier body 1 through engagement means such as a lock claw.

Figure 7:
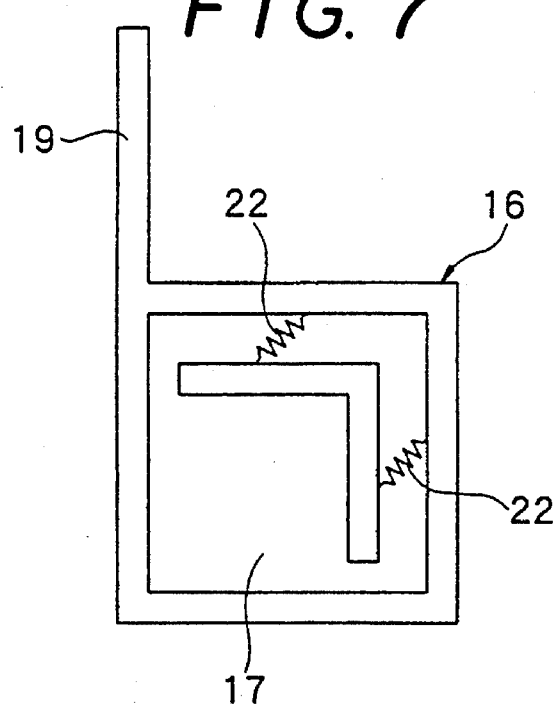
FIG. 7 is a plan view showing another example of the IC receiving case.

FIG. 7 shows another embodiment of the positioning means. In this embodiment, the IC 4 is received in the case 16. The case 16 is provided with spring members 22 (two spring members in the illustrated embodiment) for pressing the sides forming one of the opposite corner portions of the IC 4. The pressing forces of the spring members 22 cause the other corner portion of the IC 4 to be pressed against one corner portion of the case 16 for correct positioning.

In this case, corner rulers 23 are arranged within the receiving chamber 17 and the corner rulers 23 are resiliently supported by the spring members 22. The resilient forces of the spring member 22 cause the corner rulers 23 to be pressed against one of the opposite corner portions of the IC 4, and the other corner portion of the IC 4 is pressed against the corner portion of the case 16 for correct positioning. In this case, as shown in FIG. 7, the operating lever 19 may be employed in addition to the above arrangement.

Figure 8:
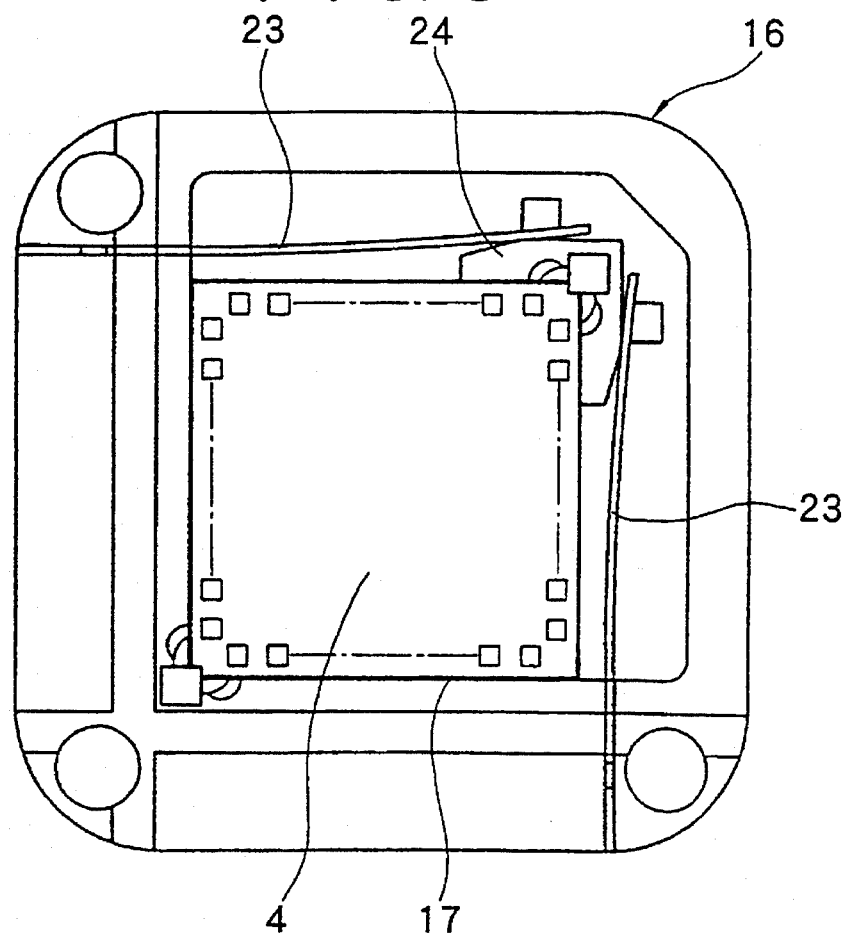
FIG. 8 is a plan view showing a further example of the IC receiving case.

FIG. 8 shows a further embodiment in which spring members are used as the positioning means.

A pair of elongated plate springs 23 are used as the spring members. The elongated plate springs 23 are laid along those sides of the IC 4, the IC being received in the receiving chamber 17 of the case 16, which form one corner portion of the IC 4. Basal ends of the pair of plate springs 23 are fixed to the case peripheral wall, and distal ends thereof are provided with a corner presser 24 movable attached thereto with some play. The resilient forces of the plate springs 23 cause the corner presser 24 to be pressed against one of the opposite corner portions of the IC 4. This corner presser 24, in turn, presses the IC 4 such that the other corner portion of the IC 4 is urged against the corner portion of the receiving chamber 17, thereby establishing a receiving position of the IC 4.

In the embodiments of FIGS. 7 and 8, the IC 4 is movably received in the receiving chamber 17 of the IC receiving case 16, and this IC 4 is biased by the spring members so that the IC 4 is moved to a correct position. The case 16 receiving the IC 4 is, in turn, received in the carrier body 1 so as to be subjected to electrical connection with the socket.

According to the present invention, the IC can be protected by the IC receiving case. Therefore, the handling is easy when the IC is loaded on or unloaded from the carrier body and in addition, the IC can effectively be prevented from being damaged.

Moreover, owing to the arrangement in which the case is moved by the positioning means within the carrier body or the IC contained in the case is moved by the positioning means, the IC can be correctly positioned.

Furthermore, owing to the arrangement in which the wiring sheet is superimposed on the IC as well as the case in such a manner as to cover the IC as well as the case, both the IC and case can be firmly carried in the carrier body without the need for an additional retainer means such as engagement claws and, at the same time, there can be obtained a reliable electrical connection between the contacts of the IC and the contacts of the socket through the wiring pattern of the wiring sheet. Thus, the present invention can advantageously be applied to a small-sized thin IC.

The present invention is not limited to the above embodiments but many modifications can be made without departing from the scope of the appended claims.

What is claimed is:

1. An IC carrier for use in mounting an IC in an IC socket, said IC carrier comprising:

an IC carrier body having an IC case-receiving chamber therein;

an IC case having an IC-receiving chamber therein, said IC case being mountable in said IC case-receiving chamber of said IC carrier body; and a positioning means for moving the IC relative to said IC carrier body when the IC is mounted in said IC-receiving chamber of said IC case and said IC case is mounted in said IC case-receiving chamber of said IC carrier body, to position the IC in a predetermined position.

2. An IC carrier as recited in claim 1, wherein said positioning means is operable to move the IC relative to said IC carrier body by moving said IC case relative to said IC carrier body.

3. An IC carrier as recited in claim 1, wherein said positioning means is operable to move the IC relative to said IC carrier body by moving the IC relative to said IC case.

4. An IC carrier as recited in claim 1, further comprising a wiring sheet having a wiring pattern thereon and being mounted to said IC carrier body, said wiring sheet covering said IC case-receiving chamber of said IC carrier body.

5. An IC carrier as recited in claim 4, wherein said positioning means is further operable to move the IC relative to said wiring sheet.

6. An IC carrier as recited in claim 1, wherein said positioning means comprises an operation lever fixed to said IC case and extending outwardly therefrom.

7. An IC carrier as recited in claim 1, wherein said positioning means comprises spring members mounted to said IC case for biasing the IC toward the predetermined position so as to move the IC relative to said IC case.

8. An IC carrier for use in mounting an IC in an IC socket, said IC carrier comprising:

an IC carrier body having an IC case-receiving chamber therein;

an IC case having an IC-receiving chamber therein, said IC case being movably mounted in said IC case-receiving chamber of said IC carrier body; and an elongated operation lever fixed to said IC case and extending outwardly therefrom to a position outside said IC carrier body.

9. An IC carrier as recited in claim 8, wherein said operation lever comprises a positioning means for moving said IC case relative to said IC carrier body to position the IC case in a predetermined position in said IC case-receiving chamber.

10. An IC carrier as recited in claim 8, further comprising a wiring sheet having a wiring pattern thereon and being mounted to said IC carrier body, said wiring sheet covering said IC case-receiving chamber of said IC carrier body.

11. An IC carrier as recited in claim 8, wherein said IC carrier body further has a wiring sheet receiving chamber with a wiring sheet support seat; and a wiring sheet, having a wiring pattern thereon, is mounted against said wiring sheet support seat, said wiring sheet covering said IC case-receiving chamber and substantially enclosing said IC case in said IC case-receiving chamber.

12. An IC carrier as recited in claim 11, further comprising a framework fixedly mounted in said wiring sheet receiving chamber along an inner periphery of said IC carrier body, said wiring sheet being interposed between said framework and said wiring sheet support seat.

* * * * *